US012572084B2

(12) United States Patent
Park et al.

(10) Patent No.: US 12,572,084 B2
(45) Date of Patent: Mar. 10, 2026

(54) METHODS OF DETERMINING OVERLAYER REFERENCE WAVELENGTH

(71) Applicant: Samsung Electronics Co., Ltd., Suwon-si (KR)

(72) Inventors: Byeongseon Park, Suwon-si (KR); Min-Cheol Kwak, Suwon-si (KR); Jungmin Lee, Suwon-si (KR); Junseong Yoon, Suwon-si (KR); Woongchan Lee, Suwon-si (KR); Woojin Jung, Suwon-si (KR); Chan Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/748,166

(22) Filed: Jun. 20, 2024

(65) Prior Publication Data

US 2025/0189902 A1      Jun. 12, 2025

(30) Foreign Application Priority Data

Dec. 12, 2023     (KR) ........................ 10-2023-0179979

(51) Int. Cl.
  *G03F 7/00*          (2006.01)
(52) U.S. Cl.
  CPC ...... *G03F 7/70633* (2013.01); *G03F 7/70616* (2013.01); *G03F 7/70681* (2023.05)
(58) Field of Classification Search
  CPC ............. G03F 7/70633; G03F 7/70616; G03F 7/70683; G03F 7/706831; G03F 7/70681
  USPC ...................... 348/135; 702/94, 189; 382/145
  See application file for complete search history.

(56) References Cited

U.S. PATENT DOCUMENTS

| | | | |
|---|---|---|---|
| 7,933,016 | B2 | 4/2011 | Mieher et al. |
| 8,229,205 | B2 | 7/2012 | Hyon et al. |
| 8,670,118 | B2 | 3/2014 | Den Boef |
| 9,093,458 | B2 | 7/2015 | Amir et al. |
| 9,455,206 | B2 | 9/2016 | Yun et al. |
| 10,890,436 | B2 | 1/2021 | Amir et al. |
| 10,908,506 | B2 | 2/2021 | Kim |
| 11,573,497 | B2 | 2/2023 | Negri et al. |
| 2022/0074867 | A1 | 3/2022 | Jung et al. |

FOREIGN PATENT DOCUMENTS

KR          10-2102302 B1      4/2020

*Primary Examiner* — Sherrie Hsia

(74) *Attorney, Agent, or Firm* — Wolf, Greenfield & Sacks, P.C.

(57) ABSTRACT

A method of determining an overlay reference wavelength, the method comprising: forming a pattern structure including a wafer and overlay keys on the wafer; obtaining first setup values of the pattern structure for first measurement wavelengths, respectively; selecting second measurement wavelengths among the first measurement wavelengths by filtering the first measurement wavelengths based on the first setup values; obtaining second setup values of the pattern structure for the second measurement wavelengths, respectively; and selecting a reference wavelength among the second measurement wavelengths based on the second setup values, wherein each of the first setup values is proportional to a deviation value of target sigma values of the overlay keys at a respective first measurement wavelength, and wherein each of the second setup values is inversely proportional to a deviation value of stack sensitivity values of the overlay keys at a respective second measurement wavelength.

20 Claims, 13 Drawing Sheets

SH

CH

SL

OVL

METHODS OF DETERMINING OVERLAYER REFERENCE WAVELENGTH

CROSS-REFERENCE TO RELATED APPLICATIONS

This U.S. non-provisional patent application claims priority under 35 U.S.C. § 119 to Korean Patent Application No. 10-2023-0179979 filed on Dec. 12, 2023, in the Korean Intellectual Property Office, the entire contents of which are hereby incorporated by reference.

BACKGROUND OF THE INVENTION

The inventive concept relates to methods of determining an overlay reference wavelength, and more specifically, relates to methods of determining a reference wavelength for an overlay measurement process by reflecting a distribution of overlay measurement values on a wafer.

As a design rule of a semiconductor device is decreasing, manufacturing technologies are being developed to improve integration of the semiconductor device. An overlay measurement process is a process that determines a degree of misalignment between upper and lower patterns of an overlay key on the wafer, and can be an important measurement process in a manufacturing process of an integrated semiconductor device. Through the overlay measurement process, overlay measurement values of overlay keys may be obtained at various locations on the wafer. However, due to variations in a photolithography process and/or an overlay measurement process, the overlay measurement values may be measured differently at each location.

SUMMARY OF THE INVENTION

An object of the inventive concept is to provide methods of determining a reference wavelength for an overlay measurement process by reflecting a distribution of overlay measurement values on a wafer.

The problem to be solved by the inventive concept is not limited to the problems mentioned above, and other problems not mentioned may be clearly understood by those skilled in the art from the description below.

A method of determining an overlay reference wavelength, the method comprising: forming a pattern structure including a wafer and overlay keys on the wafer; obtaining first setup values of the pattern structure for first measurement wavelengths, respectively; selecting second measurement wavelengths among the first measurement wavelengths by filtering the first measurement wavelengths based on the first setup values; obtaining second setup values of the pattern structure for the second measurement wavelengths, respectively; and selecting a reference wavelength among the second measurement wavelengths based on the second setup values, wherein each of the first setup values is proportional to a deviation value of target sigma values of the overlay keys at a respective first measurement wavelength among the first measurement wavelengths, and wherein each of the second setup values is inversely proportional to a deviation value of stack sensitivity values of the overlay keys at a respective second measurement wavelength among the second measurement wavelengths.

A method of determining an overlay reference wavelength, the method comprising: forming a pattern structure including a wafer and overlay keys on the wafer; obtaining target sigma values of the overlay keys for each of first measurement wavelengths; obtaining first setup values of the pattern structure for each of the first measurement wavelengths from the target sigma values of the overlay keys at a respective first measurement wavelength among the first measurement wavelengths; and selecting second measurement wavelengths among the first measurement wavelengths by filtering the first measurement wavelengths based on the first setup values, wherein each of the first setup values is proportional to an average value and a deviation value of the target sigma values of the overlay keys at the respective first measurement wavelength among the first measurement wavelengths.

A method of determining an overlayer reference wavelength, the method comprising: forming a pattern structure including a wafer and overlay keys on the wafer: obtaining first setup values of the pattern structure for each of first measurement wavelengths; selecting second measurement wavelengths among the first measurement wavelengths by filtering the first measurement wavelengths based on the first setup values: obtaining stack sensitivity values of the overlay keys for each of the second measurement wavelengths; obtaining second setup values of the pattern structure for each of the second measurement wavelengths from the stack sensitivity values of the overlay keys at a respective second measurement wavelength among the second measurement wavelengths; and selecting a reference wavelength among the second measurement wavelengths based on the second setup values, wherein each of the second setup values is proportional to an average value of the stack sensitivity values of the overlay keys at the respective second measurement wavelength among the second measurement wavelengths and inversely proportional to a deviation value of the stack sensitivity values of the overlay keys at the respective second measurement wavelength among the second measurement wavelengths.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A to 6C are cross-sectional views illustrating an alignment of a lower pattern and a photoresist pattern of an overlay key.

DETAILED DESCRIPTION

Hereinafter, the inventive concept will be described in detail with reference to the accompanying drawings.

Figure 1:
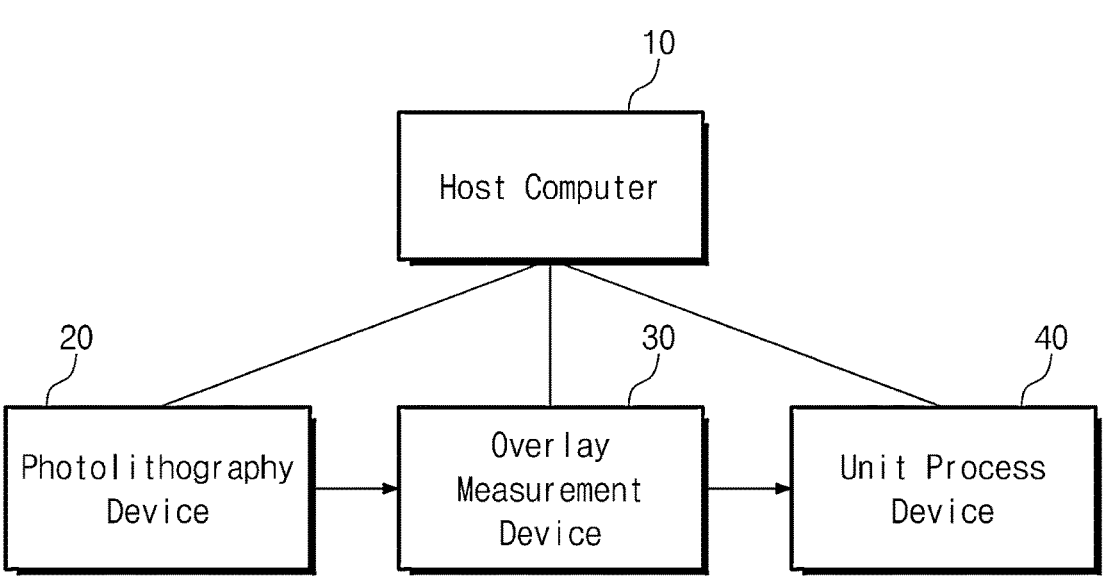
FIG. 1 is a diagram illustrating some of apparatuses for manufacturing a semiconductor device.

FIG. 1 is a diagram illustrating some of apparatuses for manufacturing a semiconductor device.

Referring to FIG. 1, apparatuses for manufacturing a semiconductor device may include a host computer 10, a photolithography device 20, an overlay measurement device 30, and a unit process device 40.

The host computer 10 may be connected to (may communicate with) the photolithography device 20, overlay measurement device 30, and unit process device 40. The host computer 10 may monitor a manufacturing process of a semiconductor device. For example, an overlay measurement process of a semiconductor device may be performed in (by) the overlay measurement device 30, and the host computer 10 may monitor the overlay measurement process.

The photolithography device 20 may include a spinner device, an exposure device, and a development device. A photolithography process may be performed on a wafer (e.g., wafer WF in FIG. 3) through sequential processes in the spinner device, the exposure device, and the development device.

In the spinner device, a photoresist layer may be formed on the wafer. Forming the photoresist layer may include providing a photoresist material in a solution state on a wafer, and coating the photoresist material on the wafer by spinning the wafer (at high speed). For example, prior to providing the photoresist material, an adhesion promotion process may be further performed to effectively adhere the photoresist material to the wafer. The photoresist material may include organic polymer.

In the exposure device, the photoresist layer on the wafer may be exposed to light, such as ultraviolet (UV) or extreme ultraviolet (EUV). The light may pass through a reticle and reach the photoresist layer, thereby exposing a portion of the photoresist layer along the pattern of the reticle to light. The exposed portion of the photoresist layer may undergo a photochemical reaction and change chemical properties thereof through the exposure process. For example, the exposure device may be, for example, an EUV exposure machine, an ArF exposure machine, a KrF exposure machine, an i-line exposure machine, and/or a G-line exposure machine.

In a development device, a portion of the photoresist layer may be removed by reacting with a developing material, and the remaining photoresist layer may constitute a photoresist pattern. For example, when the photoresist layer is a positive photoresist layer, the portion of the photoresist layer exposed to the light in the exposure device may react with the developing material and be removed. When the photoresist layer is a negative photoresist layer, the other portion of the photoresist layer that is not exposed to the light in the exposure device may react with the developing material and be removed.

The overlay measurement process may be performed in (by) the overlay measurement device 30. A degree of deviation between the photoresist pattern formed in (by) the photolithography device 20 and the lower pattern therebelow (e.g., photoresist pattern PP and lower pattern LP in FIGS. 6A to 6C) may be measured through the overlay measurement process. In this case, the overlay measurement process may also be called after development inspection (ADI).

The unit process device 40 may include, for example, a thin layer deposition device, an etching device, a polishing device, an ion implantation device, a cleaning device, and/or an ashing device. For example, when the etching device is provided, an etching process may be performed on an upper layer (e.g., an upper layer UL in FIGS. 6A to 6C) on the lower pattern using the photoresist pattern as a mask to form an upper pattern. Afterwards, a degree of distortion of the upper and lower patterns may be determined through an overlay measurement process. In this case, the overlay measurement process may also be called after cleaning inspection (ACI).

Figure 2:
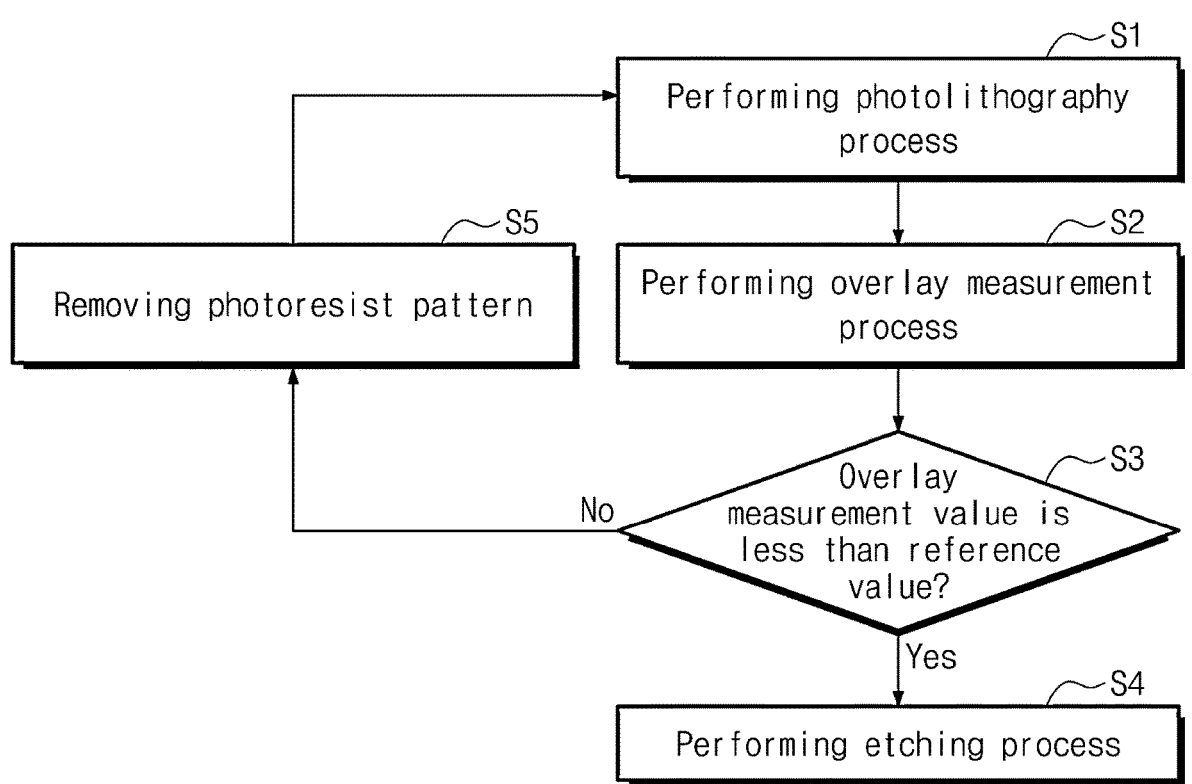
FIG. 2 is a flow chart illustrating an example of an overlay measurement process.

FIG. 2 is a flow chart illustrating an example of an overlay measurement process.

Referring to FIG. 2, a photolithography process may be performed in S1. The photolithography process may be performed in (by) the photolithography device 20 described with reference to FIG. 1. A photoresist pattern (e.g., the photoresist pattern PP) may be formed through the photolithography process.

Afterwards, an overlay measurement process for the photoresist pattern (e.g., the photoresist pattern PP) and a lower pattern (e.g., the lower pattern LP) may be performed in S2. In this case, the overlay measurement process may be ADI. Overlay measurement values for an overlay key (e.g., overlay key OVL of FIGS. 6A to 6C) including the photoresist pattern and the lower pattern may be obtained through the overlay measurement process.

Analysis of the overlay measurement values may proceed in S3. For example, when the overlay measurement value is less than a certain level of a reference value (i.e., when a degree of deviation between the photoresist pattern and the lower pattern is small enough (is within a desirable range)), a subsequent etching process may be performed in S4. As another example, when the overlay measurement value is greater than a certain level of the reference value (i.e., when a degree of deviation between the photoresist pattern and the lower pattern is too large (is out of the desirable range)), a rework process to remove the photoresist pattern may be performed in S5. Through the rework process, the existing photoresist pattern that is misaligned with respect to the lower pattern may be removed. After the rework process, a photolithography process may be performed again, and a new photoresist pattern may be formed.

Overlay measurement values obtained through the overlay measurement process such as ADI may be (continuously) monitored by the host computer 10. Accordingly, even when process conditions is changed or product defects occur due to external factors, the changes may be quickly identified and addressed. In addition, even when the photoresist pattern and the lower pattern are temporarily misaligned, the misalignment may be monitored prior to the etching process through the ADI, and defects in a final product may be prevented through a rework process.

When performing the overlay measurement process, even when an alignment of the (actual) semiconductor device patterns (e.g., an alignment of the semiconductor device patterns other than an overlay key (e.g., the overlay key OVL) in the cell region) is not directly measured (in the cell region), the alignment of the (actual) semiconductor device patterns may be measured (represented) indirectly through the overlay key. The overlay key may be a structure that is formed together with the semiconductor device patterns (in the cell region) through a patterning process and represents an alignment between the semiconductor device patterns. Herein, the term "formed together" means "formed by the same process", "formed by the same series of processes", and/or "formed simultaneously". Therefore, it is important to set up conditions for the overlay measurement process such that the measurement value for the overlay key reflects the alignment between the (actual) semiconductor device patterns as closely as possible.

Figure 3:
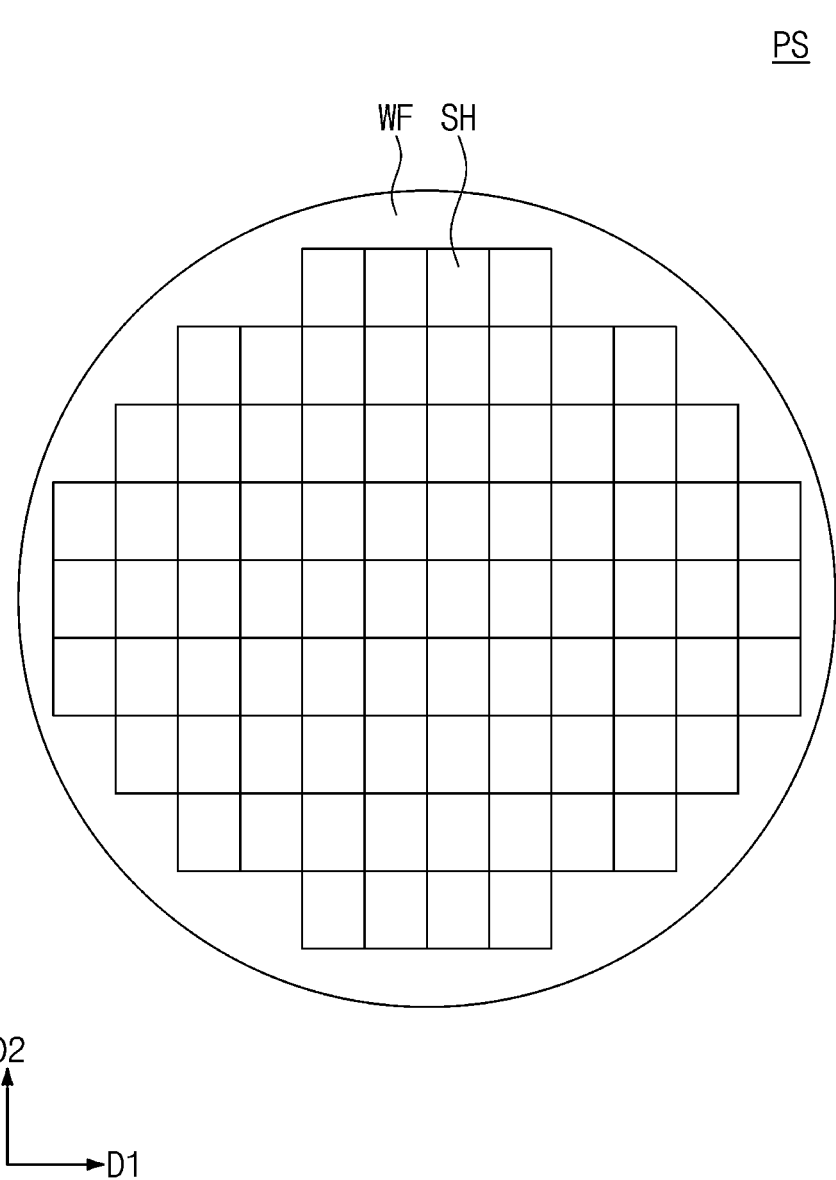
FIG. 3 is a top view illustrating an example of an arrangement of shots on a wafer.
Figure 4:
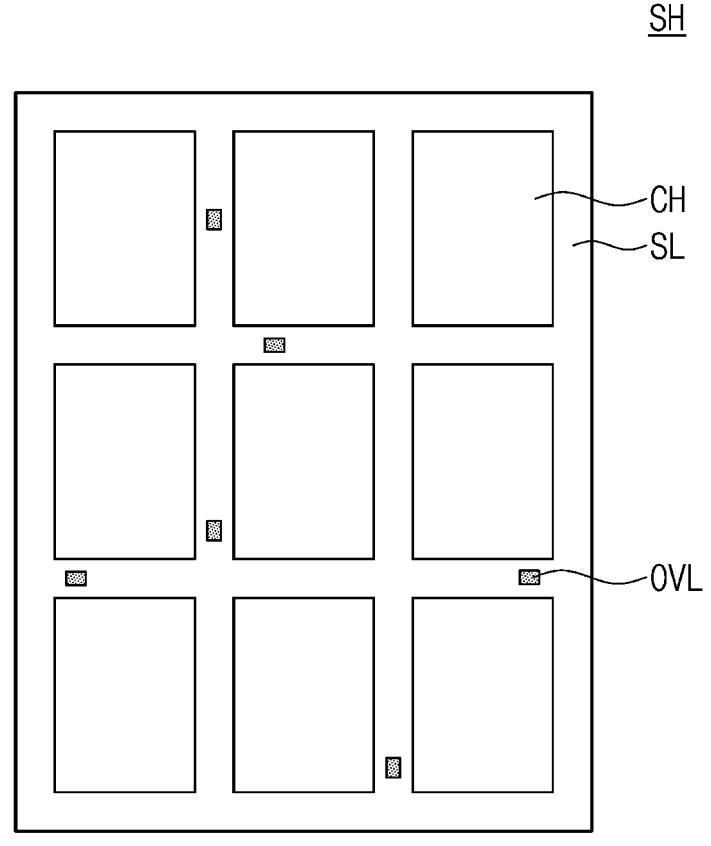
FIG. 4 is a plan view illustrating an enlarged view of the shot of FIG. 3.

FIG. 3 is a top view illustrating an example of an arrangement of shots on a wafer. FIG. 4 is a plan view illustrating an enlarged view of the shot of FIG. 3.

Referring to FIGS. 3 and 4, a pattern structure PS including one wafer WF and shots SH arranged in a planar manner on the wafer WF may be provided. The shots SH may be two-dimensionally arranged in a first direction D1 and a second direction D2 parallel to an upper surface and a lower surface of the wafer WF.

During a photolithography process, a plurality of exposure processes may be performed repeatedly while moving a position of a reticle. One shot SH may be a unit pattern formed on the wafer WF as one exposure process is performed through the reticle. The reticle may move in the first direction D1 and the second direction D2, and accordingly, the shots SH may also be arranged in the first direction D1 and the second direction D2.

The shot SH may include a plurality of chip regions CH and a scribe lane region SL (extending or crossing) between the chip regions CH. The chip regions CH may be two-dimensionally arranged in the first direction D1 and the second direction D2. The scribe lane region SL may extend around the chip regions CH. For example, each of the chip regions CH may be surrounded by a scribe lane region SL in a plan view.

As the semiconductor manufacturing process is performed, various (intermediate) patterns may be formed on the chip regions CH of the wafer WF, and ultimately semiconductor devices may be formed. For example, semiconductor memory devices such as a dynamic random access memory (DRAM), a static random access memory (SRAM), an NAND flash memory, and/or a resistive random access memory (RRAM) may be formed on the chip regions CH. In some embodiments, a processor such as a micro electro mechanical systems (MEMS) device, an optoelectronic device, a CPU, and/or a DSP may be formed on the chip regions CH. In some embodiments, standard cells including semiconductor devices such as OR gates and/or AND gates may be formed on the chip regions CH.

The scribe lane region SL may include a plurality of first scribe lane regions that extend in the first direction D1 and a plurality of second scribe lane regions that intersect the first scribe lane regions and extend in the second direction D2. The scribe lane region SL may be cut by a sawing or cutting machine after forming the semiconductor device on the chip region CH.

As a semiconductor manufacturing process is performed, various process monitoring structures may be formed on the scribe lane region SL. The process monitoring structures may be monitoring patterns for monitoring whether manufacturing processes (e.g., patterning process, etc.) of the semiconductor device proceed appropriately (according to desirable specifications). As an example, the process monitoring structures may include overlay keys OVL. Each of the overlay keys OVL may be at least one of various types of overlay keys, for example, image based overlay (IBO) keys, diffraction based overlay (DBO) keys, and fringe based overlay (FBO) keys.

Each of the shots SH may include one or more overlay keys OVL. As the shots SH are two-dimensionally arranged on a front (an upper) surface of the wafer WF, a plurality of overlay keys OVL may be distributed and arranged on (the front surface of) the wafer WF. Accordingly, when an overlay measurement process is performed, overlay measurement values may be obtained from various (e.g., most) regions on the wafer WF.

As described above, the overlay measurement process may be a process of indirectly measuring the alignment between patterns in the semiconductor device (e.g., the semiconductor device patterns in the cell region) through the overlay key (e.g., the overlay keys OVL), and the measurement value for the same overlay key may change depending on process setup conditions. An overlay reference wavelength used for overlay measurement is one of the conditions that are capable of changing the overlay measurement value. Hereinafter, a method of determining an overlay reference wavelength will be described in detail.

Figure 5:
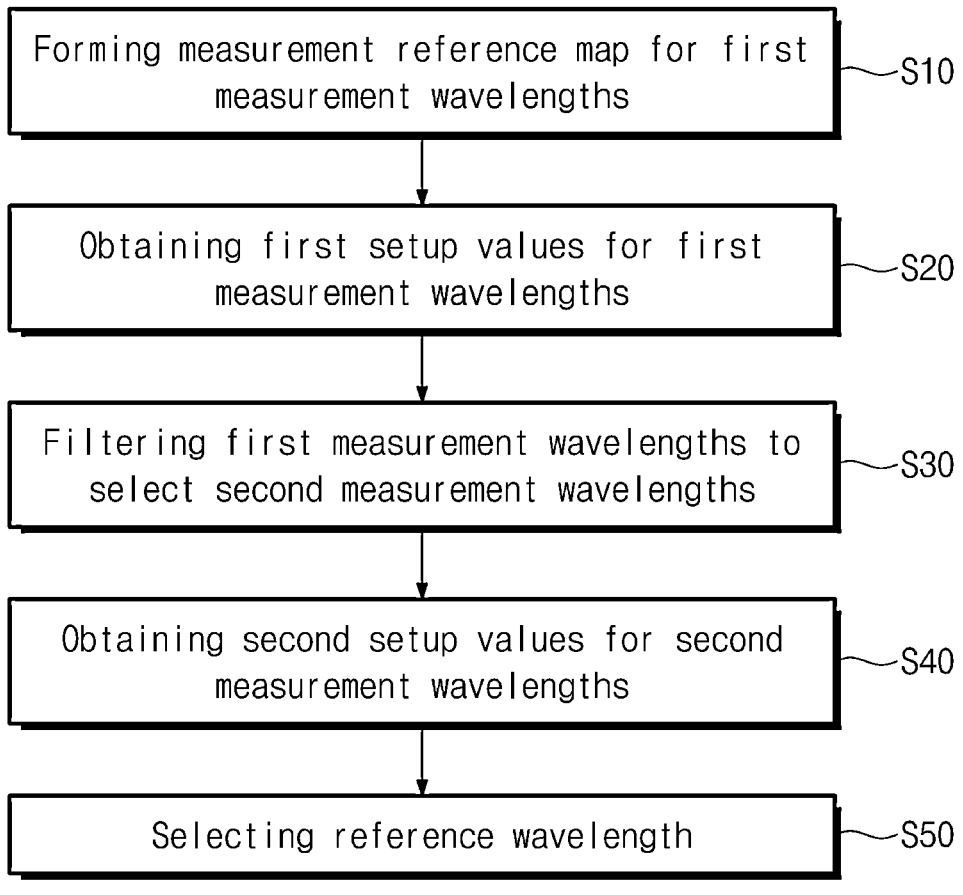
FIG. 5 is a flow chart illustrating a method of determining an overlay reference wavelength according to some embodiments of the inventive concept.
Figure 6A:
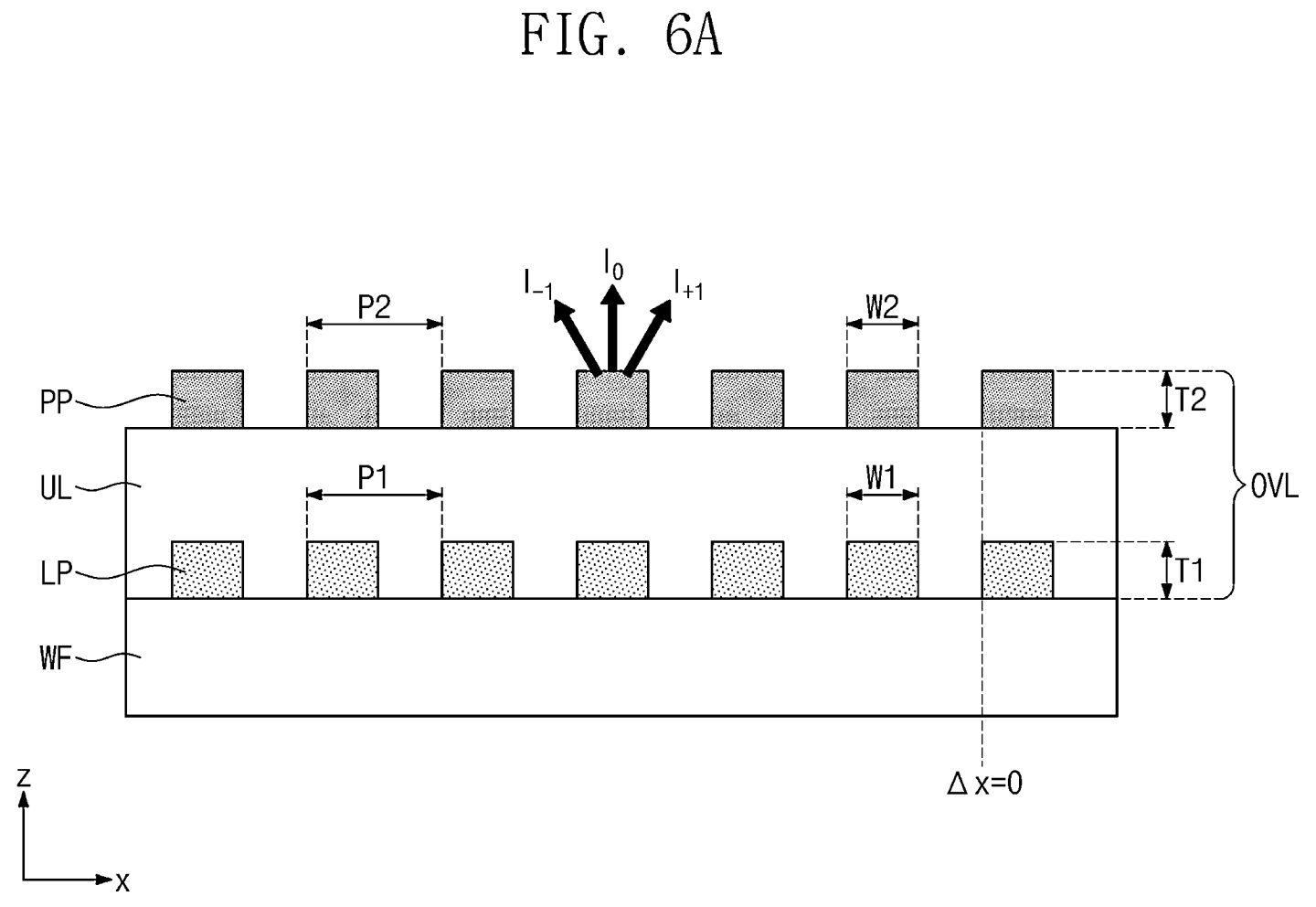
Figure 6B:
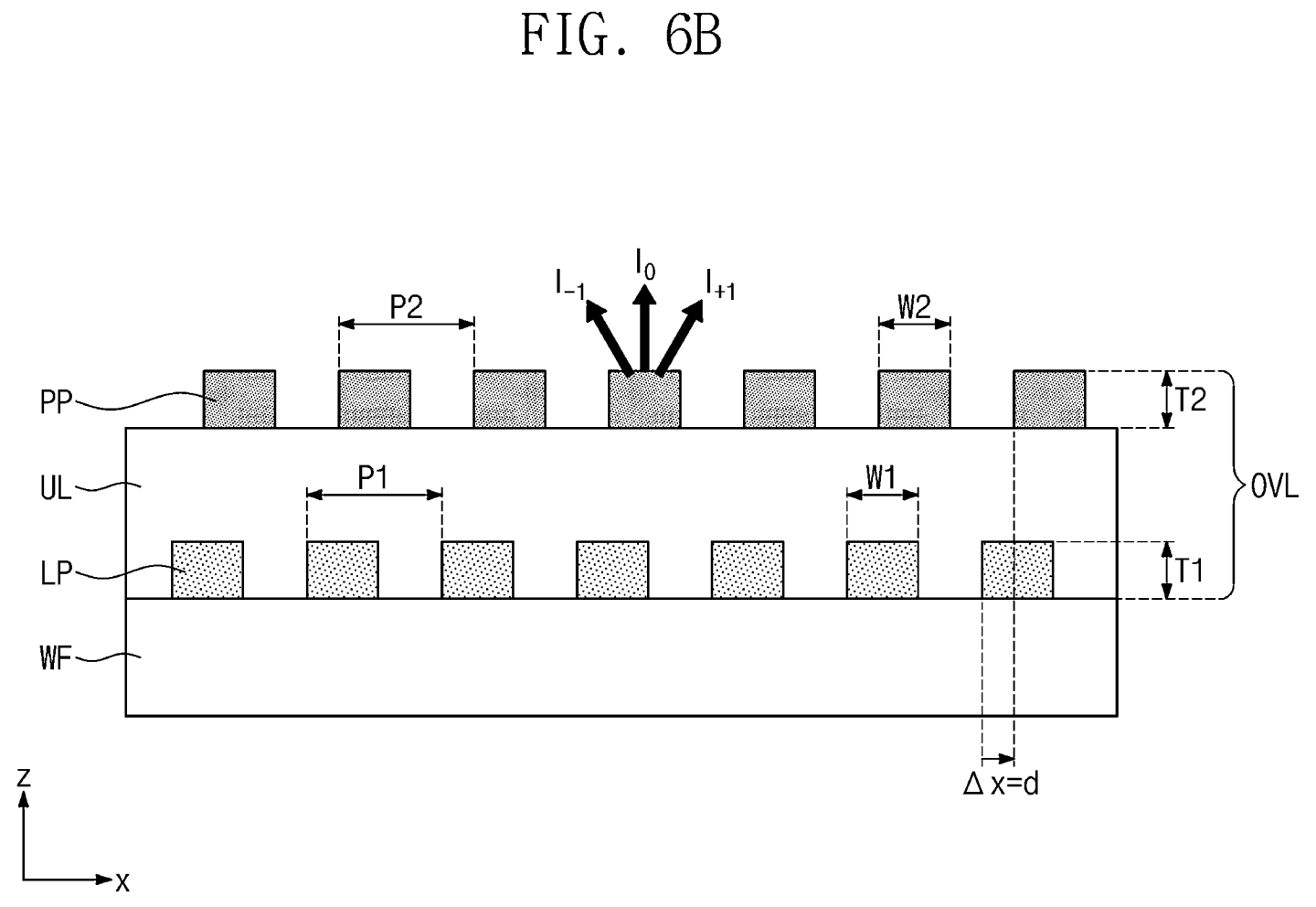
Figure 6C:
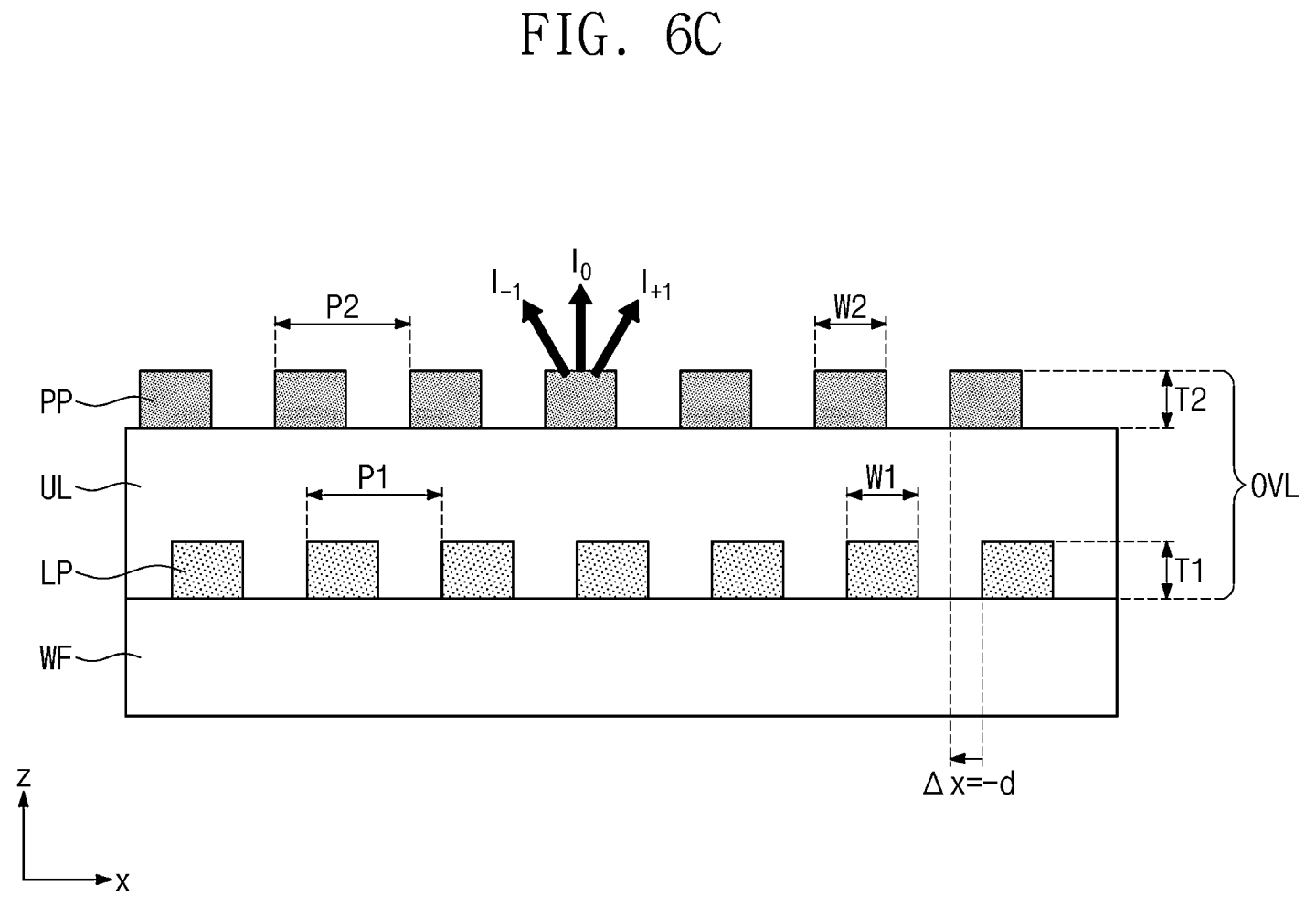

FIG. 5 is a flow chart illustrating a method of determining an overlay reference wavelength according to some embodiments of the inventive concept. FIGS. 6A to 6C are cross-sectional views illustrating an alignment of a lower pattern of an overlay key and a photoresist pattern of the overlay key.

Referring to FIG. 5, steps S10, S20, S30, S40, and S50 may be performed sequentially to determine an overlay reference wavelength. The overlay reference wavelength may be determined by performing steps S10, S20, S30, S40, and S50 with respect to one or more pattern structures PS. In this case, steps S10 and S20 may be performed simultaneously, or step S10 may be performed after step S20.

In determining the overlay reference wavelength, some of the overlay keys OVL on the wafer WF may be used, but the inventive concept is not limited thereto. When some of the overlay keys OVL are used in determining the overlay reference wavelength, measurement values for the overlay keys OVL described later should be understood as measurement values for some of the overlay keys OVL. In this specification, description is made based on 'f' overlay keys OVL ('f' is a natural number of 2 or larger). For example, two or more overlay keys OVL may be used to determine the overlay reference wavelength.

First, a measurement reference map of the pattern structure PS may be formed for first measurement wavelengths in S10. The first measurement wavelengths may be candidates for the reference wavelength set prior to obtaining the reference wavelength. Accordingly, a plurality of the first measurement wavelengths may be set as a candidate group for the reference wavelength. In this specification, description is made based on 'g' first measurement wavelengths ('g' is a natural number of 2 or larger). For example, two or more first measurement wavelengths may be set as a candidate group for the reference wavelength. The measurement reference map may be one of the reference factors for filtering the first measurement wavelengths and a map illustrating the overlay measurement values of each of the overlay keys OVL depending on positions of the overlay keys OVL on the wafer WF.

Forming the measurement reference map may include forming a measurement map for each of the first measurement wavelengths through (based on) the overlay measurement values, and merging the measurement maps through (by using) a specific function to form one measurement reference map. As an example, as an overlay measurement process for 'g' first measurement wavelengths is performed, 'g' measurement maps may be formed, and one (merged or combined) measurement reference map may be formed from the 'g' measurement maps. The one (merged or combined) measurement reference map may represent overlay measurement values for 'f' overlay keys OVL distributed on the wafer WF.

First setup values of the pattern structure PS may be obtained for the first measurement wavelengths in S20. One first setup value may be obtained for one first measurement wavelength, and, as an example, 'g' first setup values may be obtained. The first setup values may be obtained from a target sigma value of each of the overlay keys OVL (e.g., each of 'f' overlay keys OVL). The target sigma value means obtaining a plurality of overlay measurement values in (from) one overlay key OVL and then indicating a deviation value of the overlay measurement values. The target sigma value is an indicator indicating accuracy of overlay measurement in (of) the one overlay key OVL. The smaller the target sigma value of the measurement wavelength used during the overlay measurement process, the higher the accuracy of the overlay measurement in the (one) overlay key OVL.

For one first measurement wavelength, one target sigma value may be obtained from one overlay key OVL, and 'f' target sigma values may be obtained from one pattern structure PS. One first setup value may be obtained through Equation 1 from 'f' target sigma values. In this case, the first setup value is expressed as SU1, an average value and deviation value (3 sigma) of 'f' target sigma values are expressed as TS avg and TS 3σ, respectively, and a first reference constant is expressed as C1.

$$SU1 = TS\,avg * TS\,3\sigma * C1 \qquad \text{[Equation 1]}$$

That is, the first setup value may be proportional to the average and deviation values of the target sigma values of the overlay keys OVL. The first setup value may reflect the deviation value of the target sigma values of the overlay keys OVL (e.g., 'f' overlay keys OVL) distributed on the wafer WF. Accordingly, the first setup value may be a factor reflecting the measurement distribution of overlay keys OVL that are measured differently by location.

As mentioned above, the smaller the target sigma value, the higher the accuracy of overlay measurement in the overlay key OVL. As the first setup value is also proportional to the average value of target sigma values, the smaller the size, the higher the accuracy of overlay measurement. That is, the smaller the first setup value is, the higher the accuracy of the overlay measurement. In addition, in Equation 1, the first setup value is set to be proportional to the deviation value of the target sigma values such that the first setup value becomes small (smaller) as it is less affected by measurement distribution depending on the measurement location. Accordingly, as the wavelength has a small (smaller) first setup value, the influence the measurement distribution depending on the measurement location may be small (smaller) during the overlay measurement process (if, for example, the effect of the average value of the target sigma values is excluded).

The first setup value for each of the first measurement wavelengths may be obtained, thereby obtaining a total of 'g' first setup values. In this case, for efficient management of the first setup value, the first reference constant C1 may be reflected in Equation 1. However, as the first reference constant C1 is reflected in all the 'g' first setup values, the order of magnitude among the 'g' first setup values may be the same (may not change) despite the first reference constant C1.

Some of the first measurement wavelengths (some of the 'g' first measurement wavelengths) may be selected as second measurement wavelengths in S30. As an example, 'h' out of the 'g' first measurement wavelengths may be selected as the second measurement wavelengths ('h' is a natural number of 2 or more and g or less). The first measurement wavelengths may be filtered based on the first setup values and the measurement reference maps to select the second measurement wavelengths. In detail, first setup values that satisfy a certain standard may be selected among the 'g' first setup values. Additionally, the 'g' measurement maps may be compared with a measurement standard map, and thus measurement maps that satisfy the certain standard may be selected. After the first setup values and measurement maps that satisfy the criteria are selected, the first measurement wavelengths corresponding thereto may be defined as the second measurement wavelengths.

Thereafter, second setup values of the pattern structure PS may be obtained for the second measurement wavelengths in S40. One second setup value may be obtained for one second measurement wavelength, and for example, one second setup value may be obtained. The second setup values may be obtained from a stack sensitivity of each of the overlay keys OVL. The stack sensitivity value may be an indicator of how small misalignment may be measured during the overlay measurement process. For example, the stack sensitivity value may be a resolution for the misalignment in the overlay key OVL. As the stack sensitivity value of the measurement wavelength used in the overlay measurement process is larger, it may be easy (easier) to measure fine misalignment in the overlay key OVL. Hereinafter, calculation of the stack sensitivity value will be described with reference to FIGS. 6A to 6C.

Referring to FIGS. 6A to 6C, an overlay key OVL may be provided on the wafer WF. The overlay key OVL may include, for example, a lower pattern LP, an upper layer UL on the lower pattern LP, and a photoresist pattern PP on the upper layer UL. Thicknesses T1 and T2 (in a vertical direction that is perpendicular to the upper and/or lower surfaces of the wafer WF), widths W1 and W2 (e.g., in an x direction) and pitches P1 and P2 of the lower pattern LP and photoresist pattern PP (e.g., in the x direction), along with other parameters, may be factors that are capable of affecting the overlay measurement value. The thickness T1 of the lower pattern LP may be the same as or different from the thickness T2 of the photoresist pattern PP. The width W1 of the lower pattern LP may be the same as or different from the width W2 of the photoresist pattern PP. The pitch P1 of the lower pattern LP may be the same as or different from the pitch P2 of the photoresist pattern PP. Herein, pitches (e.g., the pitches P1 and P2 of the lower pattern LP and photoresist pattern PP) may refer to a distance (e.g., a distance in the x direction) between a point of a first pattern (e.g., a first lower pattern LP or a first photoresist pattern PP) and a corresponding point of a second pattern (e.g., a second lower pattern LP or a second photoresist pattern PP) adjacent to the first pattern.

FIG. 6A shows that the lower pattern LP and the photoresist pattern PP are aligned in the x direction. FIG. 6B shows that the photoresist pattern PP is offset by d in the x direction compared to the lower pattern LP. FIG. 6C shows that the photoresist pattern PP is offset by −d in the x direction compared to the lower pattern LP. Here, the x direction may be either the first direction D1 or the second direction D2 in FIG. 4. During the overlay measurement process, diffracted light may be measured from the overlay key OVL. Here, for simplicity, only the 0th, +1st, and −1st order diffracted lights are shown, and intensities thereof are denoted as I0, I+1, and I−1, respectively.

In this case, the stack sensitivity value SS may be obtained through Equation 2.

$$SS = \frac{2[(I_{p,pb} - I_{m,pb}) - (I_{p,nb} - I_{m,nb})]}{d[(I_{p,pb} + I_{m,pb}) + (I_{p,nb} + I_{m,nb})]} \qquad \text{[Equation 2]}$$

Here, 'I' represents an intensity of diffracted light. Among subscripts. 'p' represents a +1st order diffraction component, and among the subscripts 'm' represents a −1st order diffraction component. Among the subscripts, 'pb' indicates that the photoresist pattern PP moves in the x direction with respect to the lower pattern LP, and among the subscripts, 'nb' indicates that the photoresist pattern PP moves in the opposite x direction with respect to the lower pattern LP. 'd' represents a degree to which the photoresist pattern PP is offset with respective to the lower pattern LP.

Referring again to FIG. 5, for one second measurement wavelength, one stack sensitivity value may be obtained from one overlay key OVL, thereby obtaining 'f' stack sensitivity values from one pattern structure PS. One second setup value may be obtained through Equation 3 from the 'f' stack sensitivity values. In this case, a second setup value is expressed as SU2, an average value and a deviation value (3 sigma) of the 'f' stack sensitivity values are expressed as SS avg and SS 3σ, respectively, and a second reference constant is expressed as C2.

$$SU2 = \frac{SS\ avg}{SS\ 3\sigma} * C2 \qquad \text{[Equation 3]}$$

That is, the second setup value may be proportional to the average value of the ('f) stack sensitivity values of the overlay keys OVL and may be inversely proportional to the deviation value of the ('f) stack sensitivity values. The second setup value may reflect a deviation value of the stack sensitivity values of the overlay keys OVL distributed on the wafer WF. Accordingly, the second setup value may be a factor reflecting the measurement distribution of overlay keys OVL that are measured differently by location.

As mentioned above, as the stack sensitivity value is larger, it may be easy (easier) to measure fine misalignment in the overlay key OVL. Because the second setup value (SU2) is also proportional to the average value of the stack sensitivity values (SS avg), it may be easy (easier) to measure even tiny misalignment as the size is larger. That is, the measurement wavelength with the larger second setup value may be more advantageous in measuring misalignment. In addition, in Equation 3, the second setup value is set to be inversely proportional to the deviation value of the stack sensitivity values (SS 3σ) such that the second setup value becomes larger as it is less affected by measurement distribution depending on the measurement position (location). Accordingly, as the wavelength with the second setup value is larger, the influence of measurement distribution depending on the measurement location may be small (smaller) during the overlay measurement process.

For example, as the deviation value of the stack sensitivity values (SS 3σ) is smaller, the second setup value (SU2) may be large (larger). Accordingly, as the second setup value is larger, the distribution of measurement values of the distributed overlay keys OVL may be effectively reflected.

The second setup value (SU2) for each of the second measurement wavelengths may be obtained, thereby obtaining a total of 'h' second setup values. In this case, for efficient management of the second setup value, the second reference constant C2 may be reflected in Equation 3. However, as the second reference constant C2 is reflected in all the 'h' second setup values, the order of magnitude among the 'h' second setup values may be the same (may not change) despite the second reference constant C2.

One of the second measurement wavelengths may be selected as the reference wavelength in S50. The reference wavelength may be selected as one of the second measurement wavelengths based on the 'h' second setup values (SU2). After the second setup value that satisfies a certain standard is selected among the 'h' second setup values, the second measurement wavelength corresponding thereto may be selected as the reference wavelength.

According to the inventive concept, the first setup value (SU1) and the second setup value (SU2) are factors that are capable of reflecting the measurement distribution in the overlay keys OVL distributed on the wafer WF. The overlay reference wavelength may be selected based thereon (based on the first and second setup values), and thus, the overlay measurement process may be effectively managed through the reference wavelength.

Additionally, after selecting some of the first measurement wavelengths as second measurement wavelengths, the second setup values (SU2) for the second measurement wavelengths may be obtained. Accordingly, when obtaining the second setup value, only a relatively small number of wavelengths may be used, and the reference wavelength may be efficiently selected.

Figure 7:
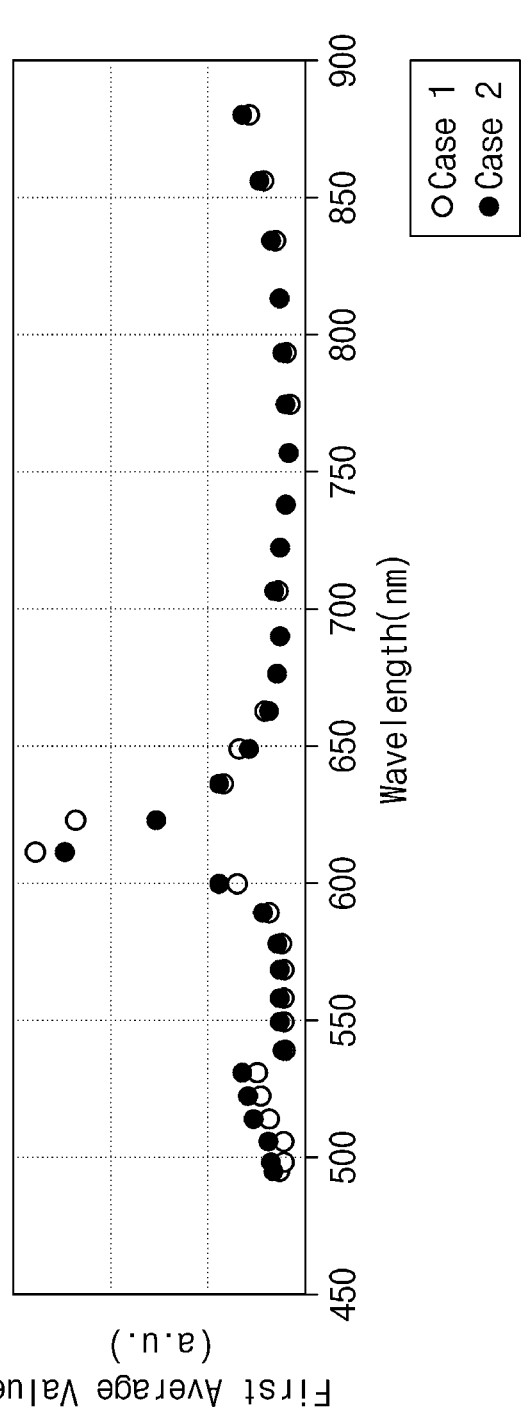
FIG. 7 is a graph illustrating a first average value according to a measurement wavelength of a pattern structure.
Figure 8:
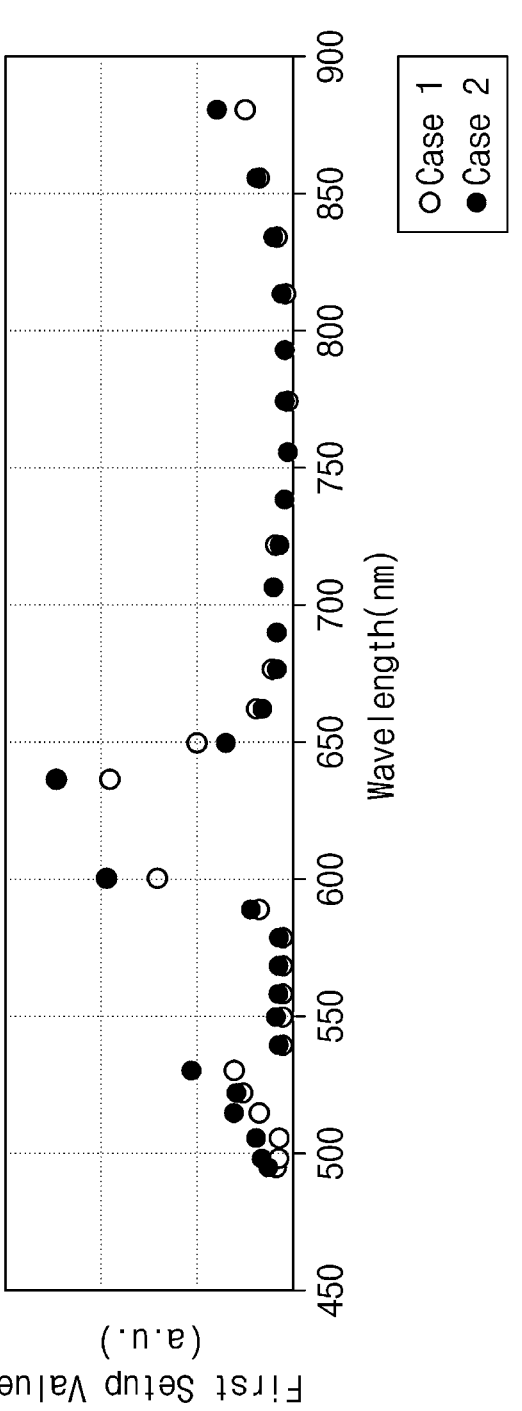
FIG. 8 is a graph illustrating a first setup value according to a measurement wavelength of a pattern structure.

FIG. 7 is a graph illustrating a first average value according to a measurement wavelength of a pattern structure. FIG. 8 is a graph illustrating a first setup value according to a measurement wavelength of a pattern structure.

Referring to FIG. 7, a first average value may be defined. The first average value refers to an average value of target sigma values (TS avg) measured at a specific wavelength. Case1 and Case2 are different pattern structures PS and generally show similar first average values at the same measurement wavelength. However, in a range where a measurement wavelength is 600 nm to 650 nm, it is confirmed that the first average value of Case 1 is higher than that of Case 2.

Referring to FIG. 8, first setup values (SU1) of Case1 and Case2 are shown. That is, not only the average value of the target sigma values (TS avg) but also the deviation value (TS 30) is reflected in FIG. 8. In this case, unlike FIG. 7, it is confirmed that the first setup value (SU1) of Case 1 is lower than that of Case 2 in a range where the measurement wavelength is 600 nm to 650 nm. That is, when only the average value of the target sigma values is considered, measurement analysis related to the target sigma values of Case 1 and Case 2 may be changed (e.g., reversed). In this case, when the first setup value is selected as shown in FIG. 8, the overlay reference wavelength may be selected based on information reflecting the distribution in the distributed overlay keys OVL.

Figure 9:
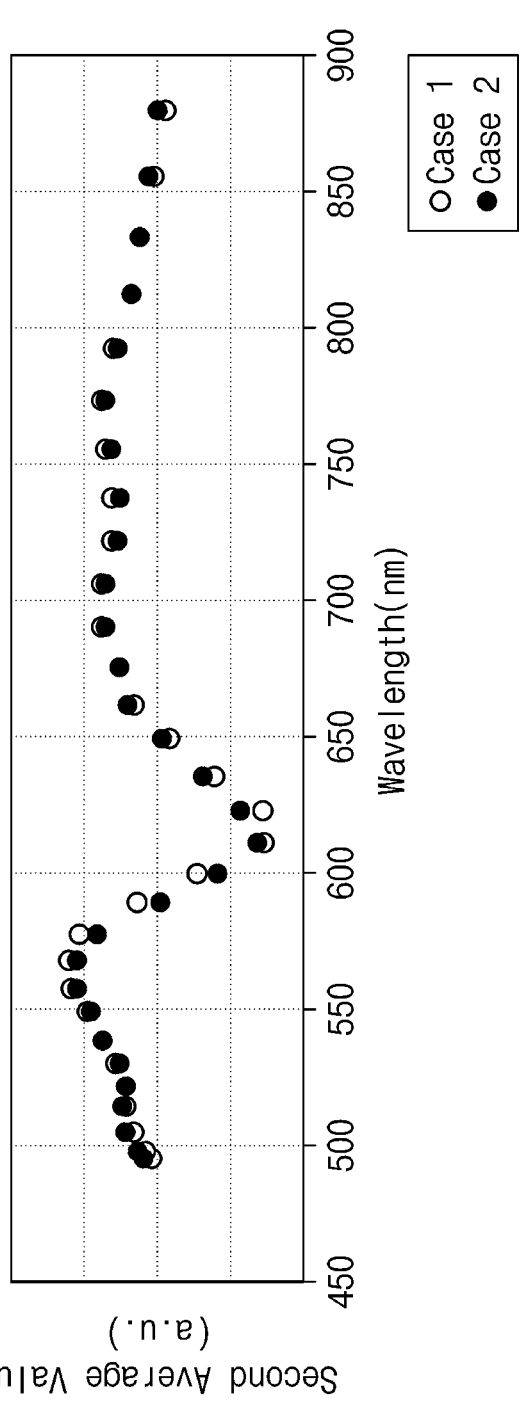
FIG. 9 is a graph illustrating a second average value according to a measurement wavelength of a pattern structure.
Figure 10:
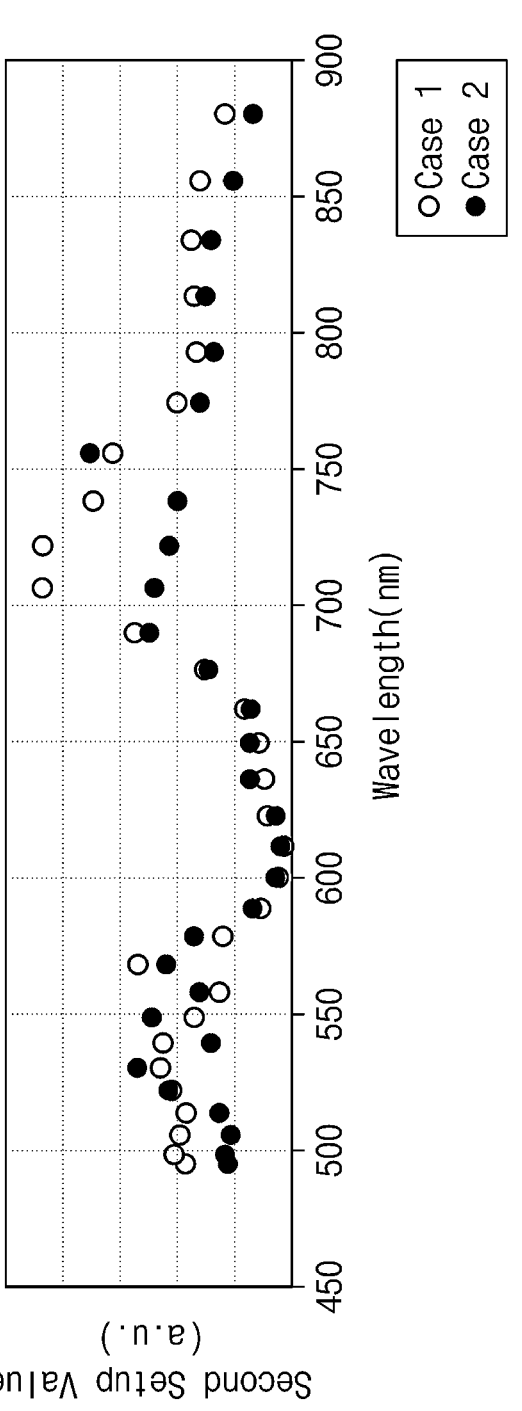
FIG. 10 is a graph illustrating a second setup value according to a measurement wavelength of a pattern structure.

FIG. 9 is a graph illustrating a second average value according to a measurement wavelength of a pattern structure. FIG. 10 is a graph illustrating a second setup value according to a measurement wavelength of a pattern structure.

Referring to FIG. 9, a second average value may be defined. The second average value refers to an average value of stack sensitivity values (SS avg) measured at a specific wavelength. Case1 and Case2 show generally similar second average values at the same measurement wavelength.

Referring to FIG. 10, second setup values of Case1 and Case2 (SU2) are shown. That is, not only the average value of the stack sensitivity values (SS avg), but also the deviation value (SS 3σ) is reflected in FIG. 10. In this case, unlike FIG. 9, Case1 and Case2 have different second setup values in more than half of the measurement wavelength range. As in the case of the first setup value, when the deviation value of the stack sensitivity values is reflected, the measurement analysis related to the stack sensitivity values of Case 1 and Case 2 may be changed. In this case, when the second setup value is selected as shown in FIG. 10, the overlay reference wavelength may be selected based on information reflecting the distribution in the distributed overlay keys OVL.

Figure 11:
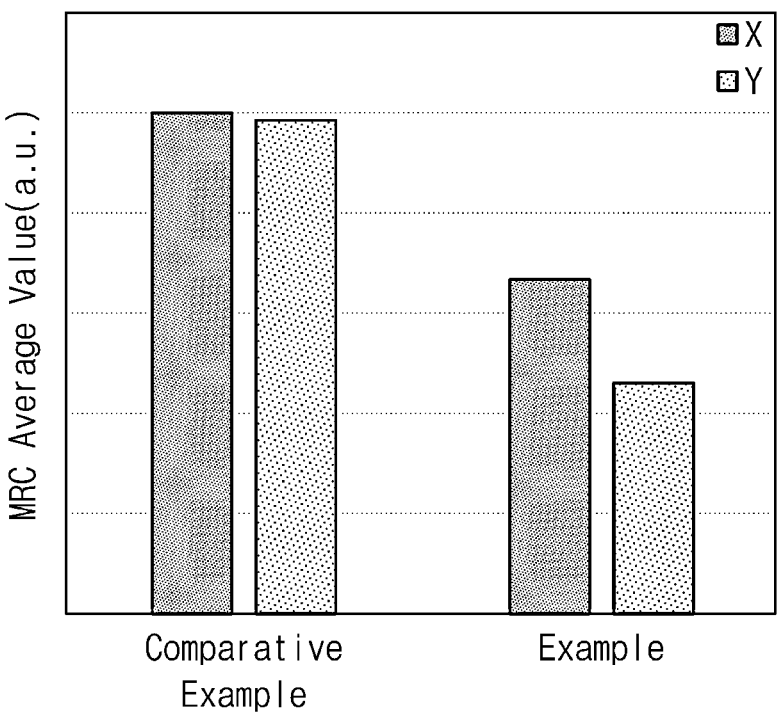
FIG. 11 is a graph illustrating an MRC average value according to a method of determining an overlay reference wavelength of a pattern structure.
Figure 12:
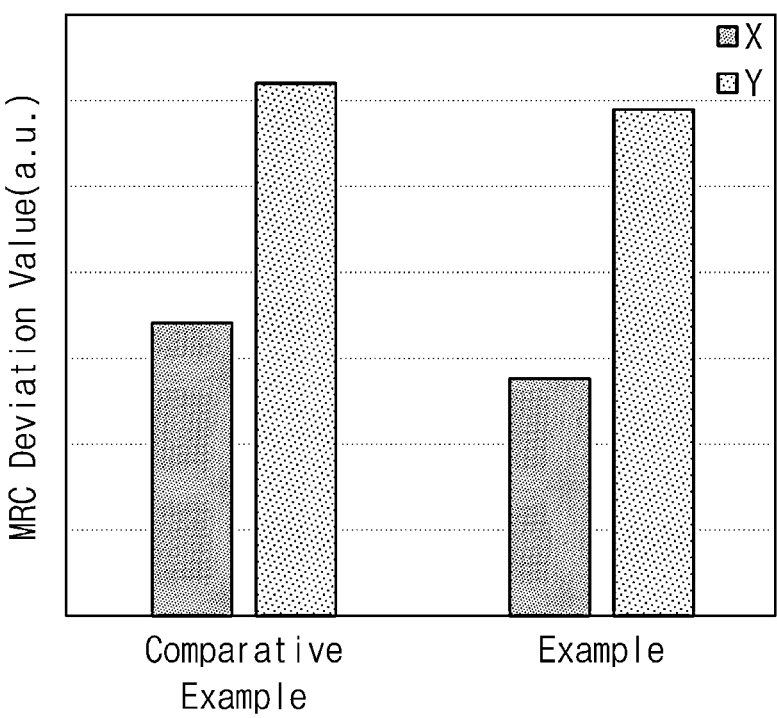
FIG. 12 is a graph illustrating an MRC deviation value according to a method of determining an overlay reference wavelength of a pattern structure.

FIG. 11 is a graph illustrating an MRC average value according to a method of determining an overlay reference wavelength of a pattern structure. FIG. 12 is a graph illustrating an MRC deviation value according to a method of determining an overlay reference wavelength of a pattern structure.

FIGS. 11 and 12 show mis-reading correction (MRC) average values and deviation values of Comparative Example and Example for the X and Y directions. The MRC value represents a difference between measured values in ADI and ACI. In ADI, measurement values from the overlay key OVL may be obtained, and in ACI, measurement values of the (actual) semiconductor pattern (e.g., the semiconductor pattern other than the overlay key OVL) may be obtained. Accordingly, a process of converting the measured values of ADI and ACI into specific parameters may be required prior to obtaining the MRC value so that the measured values of ADI and ACI may be compared with each other.

In the case of Comparative Example, a reference wavelength for performing ADI was selected based on the first average value (TS avg) and second average value (SS avg). In the case of Example, a reference wavelength for performing ADI was selected based on the first setup value (SU1) and the second setup value (SU2). Comparative Example and Example show a difference between ACI measured values after performing ADI at each reference wavelength.

Referring to FIG. 11, an average MRC value of Example was found to be smaller than that of Comparative Example in both the X and Y directions. Accordingly, when performing ADI by selecting the reference wavelength through the first and second setup values rather than selecting the reference wavelength through the first and second average values, an alignment between the upper and lower patterns after etching may be better predicted in previous measurement step before etching.

Referring to FIG. 12, a MRC deviation value of Example was found to be smaller than that of Comparative Example in both the X and Y directions. Accordingly, when performing ADI by selecting the reference wavelength through the first and second setup values rather than selecting the reference wavelength through the first and second average values, reliability of the ADI measurement value may be improved.

According to the inventive concept, the first setup value and the second setup value are factors that may reflect the measurement distribution in the overlay keys distributed on the wafer. As the overlay reference wavelength is selected based thereon, the overlay measurement process may be effectively managed through the reference wavelength.

Additionally, after selecting some of the first measurement wavelengths as second measurement wavelengths, the second setup values for the second measurement wavelengths may be obtained. In addition, when obtaining the second setup value, the relatively small number of the wavelengths may be used, and the reference wavelength may be efficiently selected.

While embodiments are described above, a person skilled in the art may understand that many modifications and variations are made without departing from the scope of the inventive concept defined in the following claims. Accordingly, the example embodiments of the inventive concept should be considered in all respects as illustrative and not restrictive, with the scope of the inventive concept being indicated by the appended claims.

What is claimed is:

1. A method of determining an overlay reference wavelength, the method comprising:

forming a pattern structure including a wafer and overlay keys on the wafer;

obtaining first setup values of the pattern structure for first measurement wavelengths, respectively;

selecting second measurement wavelengths among the first measurement wavelengths by filtering the first measurement wavelengths based on the first setup values;

obtaining second setup values of the pattern structure for the second measurement wavelengths, respectively; and selecting a reference wavelength among the second measurement wavelengths based on the second setup values, wherein each of the first setup values is proportional to a deviation value of target sigma values of the overlay keys at a respective first measurement wavelength among the first measurement wavelengths, and wherein each of the second setup values is inversely proportional to a deviation value of stack sensitivity values of the overlay keys at a respective second measurement wavelength among the second measurement wavelengths.

2. The method of claim 1, wherein the obtaining the first setup values of the pattern structure includes:

obtaining the target sigma values of the overlay keys for each of the first measurement wavelengths; and obtaining the first setup values of the pattern structure for each of the first measurement wavelengths from the target sigma values of the overlay keys at the respective first measurement wavelength among the first measurement wavelengths.

3. The method of claim 1, wherein each of the first setup values is proportional to an average value of the target sigma values of the overlay keys at the respective first measurement wavelength among the first measurement wavelengths.

4. The method of claim 1, wherein the obtaining the second setup values of the pattern structure includes:

obtaining the stack sensitivity values of the overlay keys for each of the second measurement wavelengths; and obtaining the second setup values of the pattern structure for each of the second measurement wavelengths from the stack sensitivity values of the overlay keys at the respective second measurement wavelength among the second measurement wavelengths.

5. The method of claim 1, wherein each of the second setup values is proportional to an average value of the stack sensitivity values of the overlay keys at the respective second measurement wavelength among the second measurement wavelengths.

6. The method of claim 1, further comprising:
forming measurement reference maps of the pattern structure by obtaining overlay measurement values of the overlay keys for each of the first measurement wavelengths,
wherein the filtering the first measurement wavelengths is further based on the measurement reference maps.

7. The method of claim 1, wherein each of the overlay keys is an image based overlay (IBO) key, a diffraction based overlay (DBO) key, and/or a fringe based overlay (FBO) key.

8. The method of claim 1, wherein each of the overlay keys includes a lower pattern on the wafer, an upper layer on the lower pattern, and a photoresist pattern on the upper layer.

9. The method of claim 8, wherein each of the second setup values represents an alignment of the photoresist pattern with respect to the lower pattern.

10. The method of claim 1, wherein obtaining the first setup values comprises using a first equation that includes the target sigma values,
wherein obtaining the second setup values comprises using a second equation that includes the stack sensitivity values, and
wherein the first equation is different from the second equation.

11. The method of claim 1, wherein the target sigma values represent accuracies of the overlay keys at the respective first measurement wavelength among the first measurement wavelengths, and
wherein the stack sensitivity values represent resolutions of the overlay keys at the respective second measurement wavelength among the second measurement wavelengths.

12. The method of claim 1, wherein each of the first setup values is proportional to a first reference constant, and
wherein each of the second setup values is proportional to a second reference constant.

13. A method of determining an overlay reference wavelength, the method comprising:
forming a pattern structure including a wafer and overlay keys on the wafer;
obtaining target sigma values of the overlay keys for each of first measurement wavelengths;
obtaining first setup values of the pattern structure for each of the first measurement wavelengths from the target sigma values of the overlay keys at a respective first measurement wavelength among the first measurement wavelengths; and
selecting second measurement wavelengths among the first measurement wavelengths by filtering the first measurement wavelengths based on the first setup values,
wherein each of the first setup values is proportional to an average value and a deviation value of the target sigma values of the overlay keys at the respective first measurement wavelength among the first measurement wavelengths.

14. The method of claim 13, further comprising:
forming measurement reference maps of the pattern structure by obtaining overlay measurement values of the overlay keys for each of the first measurement wavelengths,
wherein the filtering the first measurement wavelengths is further based on the measurement reference maps.

15. The method of claim 13, wherein each of the overlay keys is an image based overlay (IBO) key, a diffraction based overlay (DBO) key, and/or a fringe based overlay (FBO) key.

16. The method of claim 13, wherein each of the overlay keys includes a lower pattern on the wafer, an upper layer on the lower pattern, and a photoresist pattern on the upper layer.

17. A method of determining an overlay reference wavelength, the method comprising:
forming a pattern structure including a wafer and overlay keys on the wafer;
obtaining first setup values of the pattern structure for each of first measurement wavelengths;
selecting second measurement wavelengths among the first measurement wavelengths by filtering the first measurement wavelengths based on the first setup values;
obtaining stack sensitivity values of the overlay keys for each of the second measurement wavelengths;
obtaining second setup values of the pattern structure for each of the second measurement wavelengths from the stack sensitivity values of the overlay keys at a respective second measurement wavelength among the second measurement wavelengths; and
selecting a reference wavelength among the second measurement wavelengths based on the second setup values,
wherein each of the second setup values is proportional to an average value of the stack sensitivity values of the overlay keys at the respective second measurement wavelength among the second measurement wavelengths and inversely proportional to a deviation value of the stack sensitivity values of the overlay keys at the respective second measurement wavelength among the second measurement wavelengths.

18. The method of claim 17, further comprising:
forming measurement reference maps of the pattern structure by obtaining overlay measurement values of the overlay keys for each of the first measurement wavelengths,
wherein the filtering the first measurement wavelengths is further based on the measurement reference maps.

19. The method of claim 17, wherein each of the overlay keys is an image based overlay (IBO) key, a diffraction based overlay (DBO) key, and/or a fringe based overlay (FBO) key.

20. The method of claim 17, wherein each of the overlay keys includes a lower pattern on the wafer, an upper layer on the lower pattern, and a photoresist pattern on the upper layer.

* * * * *